US010276735B2

(12) United States Patent
Allen et al.

(10) Patent No.: US 10,276,735 B2
(45) Date of Patent: Apr. 30, 2019

(54) SEMICONDUCTOR NANOCRYSTALS

(71) Applicant: Massachusetts Institute of Technology, Cambridge, MA (US)

(72) Inventors: Peter Matthew Allen, Cambridge, MA (US); Moungi G. Bawendi, Cambridge, MA (US)

(73) Assignee: MASSACHUSETTS INSTITUTE OF TECHNOLOGY, Cambridge, MA (US)

(*) Notice: Subject to any disclaimer, the term of this patent is extended or adjusted under 35 U.S.C. 154(b) by 0 days.

(21) Appl. No.: 15/660,930

(22) Filed: Jul. 26, 2017

(65) Prior Publication Data

US 2018/0040749 A1 Feb. 8, 2018

Related U.S. Application Data

(63) Continuation of application No. 12/864,488, filed as application No. PCT/US2009/000406 on Jan. 22, 2009, now Pat. No. 9,748,422.

(Continued)

(51) Int. Cl.
*H01L 29/06* (2006.01)
*H01L 31/0352* (2006.01)
*B82Y 30/00* (2011.01)
*C01B 19/00* (2006.01)
*C09K 11/56* (2006.01)

(Continued)

(52) U.S. Cl.
CPC ........ *H01L 31/03529* (2013.01); *B82Y 30/00* (2013.01); *C01B 19/002* (2013.01); *C09K 11/565* (2013.01); *C09K 11/58* (2013.01); *C09K 11/584* (2013.01); *C09K 11/62* (2013.01); *C09K 11/623* (2013.01); *C09K 11/88* (2013.01); *H01L 31/0749* (2013.01); *C01P 2004/52* (2013.01); *C01P 2004/64* (2013.01); *Y02E 10/541* (2013.01); *Y02P 70/521* (2015.11)

(58) Field of Classification Search
CPC .......... H01L 31/03529; H01L 31/0749; B82Y 30/00; C01P 2004/52; C01P 2004/64; C09K 11/565; C09K 11/58; C09K 11/584; C09K 11/62; Y02E 10/541; Y02P 70/521
USPC .......................................................... 257/13
See application file for complete search history.

(56) References Cited

U.S. PATENT DOCUMENTS 5,985,691 A 11/1999 Basol et al.
6,322,901 B1 11/2001 Bawendi
(Continued)

FOREIGN PATENT DOCUMENTS

WO 2007/118118 10/2007

OTHER PUBLICATIONS

Zhong, Haizheng, et al., "Tuning the Luminescence Properties of Colloidal I-III-VI Semiconductor Nanocrystals for Optoelectronics and Biotechnology Applications," J Phys. Chem. Lett. (2012) vol. 3, p. 3167-3175.

(Continued)

*Primary Examiner* — Long K Tran
(74) *Attorney, Agent, or Firm* — Steptoe & Johnson LLP

(57) ABSTRACT

A semiconductor nanocrystal include a first I-III-VI semiconductor material and have a luminescence quantum yield of at least 10%, at least 20%, or at least 30%. The nanocrystal can be substantially free of toxic elements. Populations of the nanocrystals can have an emission FWHM of no greater than 0.35 eV.

30 Claims, 6 Drawing Sheets

Related U.S. Application Data

(60) Provisional application No. 61/022,885, filed on Jan. 23, 2008.

(51) Int. Cl.
*C09K 11/58* (2006.01)
*C09K 11/62* (2006.01)
*C09K 11/88* (2006.01)
*H01L 31/0749* (2012.01)

(56) References Cited

U.S. PATENT DOCUMENTS

| | | |
|---|---|---|
| 7,390,568 B2 | 6/2008 | Kim et al. |
| 7,394,094 B2 | 7/2008 | Halpert et al. |
| 7,399,429 B2 | 7/2008 | Liu et al. |
| 7,772,487 B1 | 8/2010 | Robinson |
| 2006/0236918 A1 | 10/2006 | Jin et al. |
| 2007/0152236 A1 | 7/2007 | Halpert et al. |
| 2007/0163383 A1 | 7/2007 | Van Duren et al. |
| 2008/0003855 A1 | 1/2008 | Yotsutani |
| 2008/0038558 A1 | 2/2008 | Landry et al. |
| 2008/0138289 A1* | 6/2008 | Goronkin ............ A61K 49/0063 424/9.4 |
| 2008/0202383 A1* | 8/2008 | Shi ................. B82Y 20/00 106/286.6 |
| 2008/0277626 A1* | 11/2008 | Yang ................. C09D 11/30 252/301.36 |

OTHER PUBLICATIONS

Kolny-Olesiak, Joanna, et al., "Synthesis and Application of Colloidal CuInS2 Semiconductor Nanocrystals," ACS Appl. Mater. Interfaces (2013) 5, p. 12221-12237.

De Trizio, Luca, et al., "Strongly Fluorescent Quaternary Cu—In—Zn—S Nanocrystals Prepared from Cu1-xInS2 Nanocrystals by Partial Cation Exchange," Chem. Mater. (2012) 24, p. 2400-2406.

Rice, William D., et al., "Magneto-Optical Properties of CuInS2 Nanocrystals," J Phys. Chem. Lett. (2014) 5, p. 4105-4109.

Chen, Bingkun, et al., "Highly Emissive and Color-Tunable CuInS 2-Based Colloidal Semiconductor Nanocrystals: Off-Stoichiometry Effects and Improved Electrolwninescence Performance," Adv. Funct. Mater. (2012) 22, p. 2081-2088.

International Search Report dated Sep. 11, 2009, issued in International Application No. PCT/US2009/000406.

Written Opinion of the International Searching Authority dated Sep. 11, 2009, issued in International Application No. PCT/US2009/000406.

Notification Concerning Transmittal of International Preliminary Report on Patentability (Chapter I of the Patent Cooperation Treaty) dated Aug. 5, 2010, issued in International Application No. PCT/US2009/000406.

* cited by examiner

SEMICONDUCTOR NANOCRYSTALS

CLAIM OF PRIORITY

This application is a continuation of U.S. application Ser. No. 12/864,488, filed Sep. 16, 2010, which claims priority under 35 USC 371 to International Application No. PCT/US2009/000406, filed on Jan. 22, 2009, which claims priority to provisional U.S. Patent Application No. 61/022,885, filed Jan. 23, 2008, each of which is incorporated by reference in its entirety.

FEDERALLY SPONSORED RESEARCH OR DEVELOPMENT

This invention was made with government support under contract number W911NF-07-D-0004 from the Institute for Soldier Nanotechnologies. The government has certain rights in the invention.

TECHNICAL FIELD

The invention relates to semiconductor nanocrystals.

BACKGROUND

Nanocrystals having small dimensions can have properties intermediate between molecular and bulk forms of matter. For example, nanocrystals of semiconductor materials having sufficiently small dimensions can exhibit quantum confinement of excitons (excited state electron-hole pair) in all three dimensions. Quantum confinement leads to an increase in the effective band gap of the material with decreasing crystallite size. Consequently, both the optical absorption and emission of nanocrystals shift to the blue (i.e., to higher energies) as the size of the nanocrystal decreases.

The quantum efficiency of emission from nanocrystals having a core of a first semiconductor material can be enhanced by applying an overcoating of a second semiconductor material such that the conduction band of the second semiconductor material is of higher energy than that of the first semiconductor material, and the valence band of the second semiconductor material is of lower energy than that of the first semiconductor material. As a result, both charge carriers of an exciton, i.e., electrons and holes, are confined in the core of the nanocrystal.

SUMMARY

Semiconductor nanocrystals can be highly luminescent, monodisperse, and composed of substantially non-toxic materials. The most well studied semiconductor nanocrystal system, cadmium selenide, provides highly luminescent and size controlled nanocrystals; however, cadmium is toxic. Nanocrystals that are highly luminescent, monodisperse, and composed of substantially non-toxic materials have the potential to be widely commercialized in such applications as biological imaging agents, photovoltaic cells, optoelectronic devices, and any other application where high quality non-toxic nanocrystals are necessary. Ternary and quaternary semiconducting materials (i.e., semiconducting materials that include three or four different elements, respectively) to create non-toxic, highly luminescent, and size controlled nanocrystals having a range of emission wavelengths that covers much of the visible to near infrared (NIR) regions.

Nanocrystals composed of substantially non-toxic materials can have quantum yields greater than 5%, greater than 10%, greater than 15%, greater than 20%, greater than 25%, greater than 30%, greater than 35%, or greater than 45%. Nanocrystals composed of substantially non-toxic materials can have emission wavelengths spanning the visible and near-infrared regions, such as, for example, emission wavelengths in the range of 540 nm to 975 nm. The nanocrystals can have a deviation from mean size of no greater than 25% rms, or a deviation from mean size of no greater than 15% rms.

In one aspect, a semiconductor nanocrystal includes a core including a first I-III-VI semiconductor material, wherein the nanocrystal has a luminescence quantum yield of at least 10%.

The nanocrystal can have a luminescence quantum yield of at least 20%, at least 30%, or greater. The nanocrystal can have a luminescence emission wavelength in the range of 540 nm to 975 nm. The nanocrystal can be a member of a nanocrystal population having an emission FWHM of no greater than 0.35 eV, or of no greater than 0.2 eV.

The first I-III-VI semiconductor material can include copper. The first I-III-VI semiconductor material can include silver. The core can be substantially free of toxic elements. The nanocrystal can be a member of a nanocrystal population having a deviation from mean size of no greater than 25% rms, or a deviation from mean size of no greater than 15% rms.

The core can further include a group II element. The first I-III-VI semiconductor material can be a copper indium selenide or a copper indium gallium selenide. The first I-III-VI semiconductor material can be a copper indium zinc sulfide. The first I-III-VI semiconductor material can be a silver indium selenide. The nanocrystal can include an overcoating on a surface of the core, the overcoating including a second semiconductor material. The nanocrystal can include a ligand on a surface of the semiconductor nanocrystal. The nanocrystal can be water soluble.

In another aspect, a method of making a semiconductor nanocrystal includes heating a first mixture including: a coordinating solvent, a first M donor including a Group I element, and a second M donor including a Group III element, and adding a first E donor including a Group VI element to the first mixture, thereby forming a population of nanocrystal cores including a first I-III-VI semiconductor material.

The first M donor can include copper. The first M donor can include silver. The second M donor can include indium, gallium, or a combination of indium and gallium. The first mixture can further include a third M donor including a Group II element. The method can include forming an overcoating on a surface of the core, the overcoating including a second semiconductor material.

The nanocrystal can have a luminescence quantum yield of at least 10%, at least 20%, at least 30%, or greater. The nanocrystal can have a luminescence emission wavelength in the range of 540 nm to 975 nm. The nanocrystal can be a member of a nanocrystal population having an emission FWHM of no greater than 0.35 eV, or of no greater than 0.2 eV.

The first I-III-VI semiconductor material can include copper. The core can be substantially free of toxic elements. The nanocrystal can be a member of a nanocrystal population having a deviation from mean size of no greater than 25% rms, or a deviation from mean size of no greater than 15% rms.

The core can further include a group II element. The first I-III-VI semiconductor material can be a copper indium selenide, or a copper indium gallium selenide. The first I-III-VI semiconductor material can be a copper indium zinc sulfide. The first I-III-VI semiconductor material can be a silver indium selenide. The nanocrystal can include an overcoating on a surface of the core, the overcoating including a second semiconductor material. The method can include exposing the nanocrystal to a ligand having an affinity a surface of the semiconductor nanocrystal. The semiconductor nanocrystal can be water soluble after exposure to the ligand.

Other features, objects, and advantages of the invention will be apparent from the description and drawings, and from the claims.

DETAILED DESCRIPTION

Colloidal synthesis of nanocrystals can be used to manufacture nanocrystals that have type II heterostructures. Colloidal synthesis is described, for example, in Murray, C. B., et al., J. Am. Chem. Soc. 1993, 115, 8706, Peng, X., et al., J. Am. Chem. Soc. 1997, 119, 7019, Dabbousi, B. O., et al., J. Phys. Chem. B 1997, 101, 9463, and Cao, Y. W. and Banin, U., Angew. Chem. Int. Edit. 1999, 38, 3692, each of which is incorporated by reference in its entirety. The colloidal synthetic route can be applied to any II-VI and III-V semiconductor materials. Colloidal synthesis as applied to type II heterostructure semiconductor nanocrystals is described in U.S. Patent Application Publication No. 2004/0110002, which is incorporated by reference in its entirety.

Figure 1A:
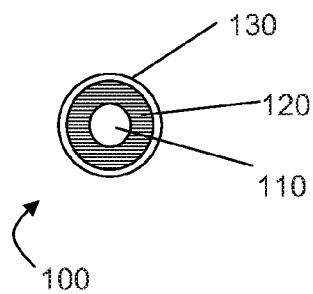
FIGS. 1A-1C are schematic depictions of semiconductor nanocrystals.
Figure 1B:
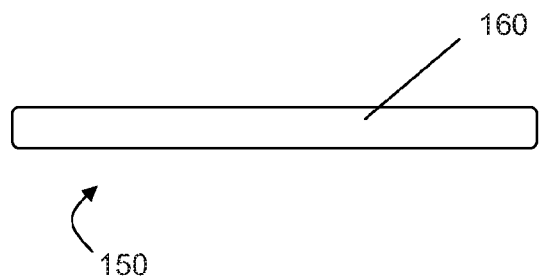
Figure 1C:
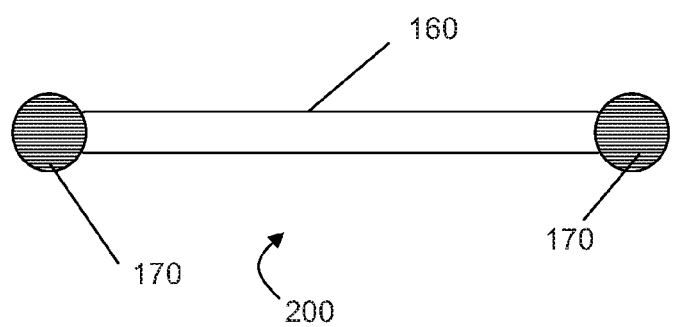
Figure 1C:
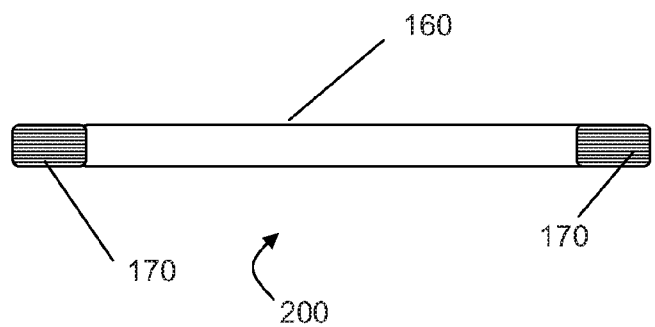

A semiconductor nanocrystal can have an approximately spherical shape, as illustrated (in cross-section) in FIG. 1A. Semiconductor nanocrystal 100 includes core 110 of a first semiconductor material. Core 110 is optionally overcoated by a second semiconductor material 120. Ligand layer 130 includes organic compounds with affinity for a semiconductor nanocrystal surface. The organic compounds can be selected for desired properties, such as solubility in a desired solvent or a desired reactivity. FIG. 1B depicts a side view of a rod-shaped semiconductor nanocrystal 150. Semiconductor nanocrystal 150 includes first semiconductor material 160. For simplicity, the ligand layer on semiconductor nanocrystal 150 has been omitted from FIG. 1B. FIG. 1C depicts barbell-shaped semiconductor nanocrystal 200. Barbell-shaped semiconductor nanocrystals can also be described as dumbbell-shaped, or as nanobarbells or nano-dumbbells Nanocrystal 200 includes a central region 160 including first semiconductor material, and distal regions 170 including a second semiconductor material. Nanocrystal 200 can be prepared by adding a second semiconductor material to the ends of rod-shaped nanocrystal 150. FIG. 1C is a schematic depiction of nanocrystals with two substantially similar distal regions at each end of a rod-shaped central region. Alternatively, nanocrystals can be prepared where only one end of a rod-shaped nanocrystal is modified with a second semiconductor material. Distal regions 170 can be approximately spherical ("dots") or approximately rod-shaped as shown in FIG. 1C. Nanocrystal 200 can be referred as barbell shaped whether the distal regions are approximately spherical or rod-shaped. If distal regions 170 are rod-shaped, distal regions 170 can have approximately the same diameter as the central region. In either case, a nanocrystal having a central region and a distal region (or regions) can be described by a length ratio. The length ratio can be defined as the length of the central region divided by the total length of the nanocrystal. When referring to a population of nanocrystals, a length ratio can be an aggregate length ratio for the population (e.g., a mean length ratio, median length ratio, or rms length ratio for the population). The central region can have length in the range of 3 nm to 100 nm (such as between 5 nm and 40 nm), and the distal region can have a radius in the range of 1 nm to 10 nm (such as between 1.5 nm and 5 nm). Accordingly, the nanocrystal can have a length ratio in the range of 0.1 to 0.95 (such as between 0.2 and 0.9). See, for example, U.S. Patent Application Publication No. 2007/0152236, which is incorporated by reference in its entirety.

A nanocrystal having a central region and a distal region (or regions) can be described by a radius ratio. The radius ratio can be defined as the ratio of the radius of the distal region to the radius of the central region. The central region can have a radius in the range of 1 nm to 7 nm (such as between 1.5 nm and 5 nm), and the distal regions can have a radius in the range of 1 nm to 10 nm (such as between 1.5 nm and 5 nm). Accordingly, a barbell-shaped nanocrystal can have a radius ratio in the range of 0.1 to 10 (such as between 0.3 and 3.5). In some embodiments the radius ratio can be about 1. In other embodiments it can be substantially different than about 1, such as, for example, between 0.1 and 0.95 or between 1.05 and 10.

The nanocrystal can be a member of a population of nanocrystals having a narrow size distribution. The nanocrystal can be a sphere, rod, disk, or other shape. The nanocrystal can include a first semiconductor material. The nanocrystal can include a first semiconductor material having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. The first semiconductor material can include a Group II-VI compound, a Group II-V compound, a Group III-VI compound, a Group III-V compound, a Group IV-VI compound, a Group I-III-VI compound, a Group II-IV-VI compound, a Group II-IV-V compound, or mixtures thereof. For example, the first semiconductor material can include for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof.

In some embodiments, the nanocrystal includes a first semiconductor material including a Group I-III-VI compound. For example, the first semiconductor material can include for example, a copper indium diselenide such as a doped copper indium diselenide or other copper indium diselenide, or alloyed copper indium diselenide, such as, for example, copper indium zinc diselenide, or copper indium gallium diselenide. The first semiconductor material can include a copper indium disulfide such as a doped copper indium disulfide or other copper indium disulfide, or alloyed copper indium disulfide. Other elements alloyed with copper indium diselenide and/or copper indium disulfide can include sulfur, aluminum, or silver; for example, $CuInS_2$, $CuIn(S, Se)_2$, $Cu(In,Al)Se_2$, $Cu(In,Ag)Se_2$, or others.

The nanocrystal can include a second semiconductor material. The second semiconductor material can a composition different from the composition of the first semiconductor material. The first and second semiconductor materials can be selected to provide a desired band structure, such as a type I or a type II heterostructure. The second semiconductor material can be adjacent to the first semiconductor material, such that a junction is formed. The junction can be abrupt or graded. In a graded junction, the first material blends with the second material in the junction, providing a graded change in material. In contrast, in an abrupt junction there is little or substantially no blending of the materials.

The junction between two semiconductor materials can have different configurations depending on the shape of the nanocrystal. For example, a spherical nanocrystal can have a spherical core of a first semiconductor material coated with a shell of a second semiconductor material. A rod shaped nanocrystal can a rod of a first semiconductor material and a second semiconductor material. The second semiconductor material can coat the length and ends of the rods substantially evenly. Alternatively, the length and ends of the rod can be coated to different degrees. In particular the ends of the rod can coated to a greater degree than the length of the rod. The ends of the rod each can be coated by an approximately spherical region of a second semiconductor material. In this case, the nanocrystal can have a barbell shape.

The second semiconductor material of the nanocrystal can include a Group II-VI compound, a Group II-V compound, a Group III-VI compound, a Group III-V compound, a Group IV-VI compound, a Group I-III-VI compound, a Group II-IV-VI compound, a Group II-IV-V compound, or mixtures thereof. For example, the second semiconductor material can include ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. For example, ZnS, ZnSe or CdS overcoatings can be grown on CdSe or CdTe nanocrystals.

An alloy can have the formula $M^1_iM^2_jM^3_kE^1_xE^2_yE^3_z$. $M^1$, $M^2$ and $M^3$ and can each independently be a group I, group II, group III, or group IV element. $E^1$, $E^2$ and $E^3$ each independently can be a group IV, group V, or group VI element. For example, $M^1$, $M^2$ and $M^3$ can each independently be magnesium, zinc, copper, cadmium, mercury, aluminum, gallium, indium, thallium, silicon, germanium, tin, or lead; and $E^1$, $E^2$ and $E^3$ each independently can be silicon, germanium, tin, lead, nitrogen, phosphorus, arsenic, antimony, oxygen, sulfur, selenium, or tellurium.

In general, the values of i, j, k, x, y, and z are nonnegative. In some instances, the value of i, j, k, x, y, or z can be an integer. For example, an alloy can have the formula $M^1E^1_xE^2_y$. In this formula, the value of i is 1 and the values of j and k are zero (alternatively, $M^1$, $M^2$ and $M^3$ are identical), and the value of z is zero (alternatively, $E^2$ and $E^3$ are identical). The sum of i, j and k can be an integer, and the sum of x, y and z can be an integer. For example, if the sum of x and y is 1, the preceding formula can be expressed as $M^1E^1_xE^2_{1-x}$. In another example, an alloy can have the formula $M^1_iM^2_{1-i}E^1$. An alloy can have the formula $M^1_iM^2_jM^3_kE^1_x$ or $M^1_iM^2_jM^3_kE^1_xE^2_y$.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region.

The population of nanocrystals can have a narrow size distribution. The population can be monodisperse and can exhibit less than a 15% rms deviation in size of the nanocrystals, preferably less than 10%, more preferably less than 5%. Spectral emissions in a narrow range of between 10 and 150 nm full width at half max (FWHM) can be observed (in other words, FWHM of less than 0.05 eV, or of less than 0.03 eV). Semiconductor nanocrystals can have emission quantum efficiencies of greater than 2%, 5%, 10%, 20%, 40%, 60%, 70%, or 80%.

The most well studied nanocrystal system, cadmium selenide, includes toxic cadmium. See, e.g., Murray C B, et al. *Ann. Rev. Matrl. Sci.* 2000, 30: 545-610, which is incorporated by reference in its entirety. Nakamura and Castro have prepared nanocrystals from nontoxic materials, but quantum yields in the range of 0.1% to 5%, or less. Nakamura H, et al. *Chem. Matr.* 2006 18:3330-3; Castro, S. et al. *J. Phys. Chem. B* 2004 108:1242-35; and Castro et al. *Chem Matrl* 2003, 15, 3142-5; each of which is incorporated by reference in its entirety. Nanocrystals that are composed of non-toxic materials, are highly luminescent (e.g., having a luminescence quantum yield of 10% or greater) and are prepared in narrow size distributions can be useful in applications such as biological imaging agents, photovoltaic cells, and optoelectronic devices. See, for example, Kim S-W, et al., *JACS* 2005, 127: 10526-10532; Zimmer J P, et al., *JACS* 2006, 128: 2526-2527; and Huynh W U, et al., *Science* 2002, 295: 2425-2427, each of which is incorporated by reference in its entirety.

The nanocrystal can composed of substantially non-toxic materials. For example, the nanocrystal can be substantially free of toxic elements such as cadmium, mercury, arsenic, thallium and lead.

The method of manufacturing a nanocrystal is a colloidal growth process and can produce a monodisperse particle population. Colloidal growth occurs by rapidly injecting an M donor(s) and an E donor(s) into a hot coordinating agent. In another variation, the M donor or M donors are dissolved in a hot coordinating agent, and an E donor or E donors are rapidly injected. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. Preparation and manipulation of nanocrystals are described, for example, in U.S. Pat. No. 6,322,901, which is incorporated by reference in its entirety.

The nanocrystal is a member of a population of nanocrystals. As a result of the discrete nucleation and controlled growth, the population of nanocrystals obtained can have a narrow, monodisperse distribution of sizes. The process of controlled growth and annealing of the nanocrystals in the coordinating agent that follows nucleation can also result in uniform surface derivatization and regular core structures. As the size distribution sharpens, the temperature can be raised to maintain steady growth. By adding more M donor or E donor, the growth period can be shortened.

The M donor(s) can be an inorganic compound, an organometallic compound (e.g., an alkyl metal compound such as triethyl gallium or trimethyl indium), or elemental metal. The inorganic compound can be a salt (e.g., a carboxylate salt, an acetylacetonate salt, a metal halide, a metal oxide, a metal alkoxide, and the like). The salt can be combined with a coordinating agent, such as an amine. See, for example, U.S. Pat. No. 6,576,291, which is incorporated by reference in its entirety. M can be cadmium, zinc, copper, magnesium, mercury, aluminum, gallium, indium or thallium. The E donor(s) can be a compound capable of reacting with the M donor to form a material with the general formula $M^1_iM^2_jM^3_kE^1_xE^2_yE^3_z$. Typically, the E donor is a chalcogenide donor or a pnictide donor, such as a phosphine chalcogenide, a bis(silyl) chalcogenide, dioxygen, an ammonium salt, or a tris(silyl) pnictide. Suitable E donors include dioxygen, bis(trimethylsilyl) selenide ($(TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride ($(TMS)_2Te$), bis(trimethylsilyl)sulfide ($(TMS)_2S$), a trialkyl phosphine sulfide such as (tri-n-octylphosphine) sulfide (TOPS), an ammonium salt such as an ammonium halide (e.g., $NH_4Cl$), tris(trimethylsilyl) phosphide ($(TMS)_3P$), tris(trimethylsilyl) arsenide ($(TMS)_3As$), or tris(trimethylsilyl) antimonide ($(TMS)_3Sb$). In certain embodiments, the M donor and the E donor can be moieties within the same molecule.

A coordinating agent can help control the growth of the nanocrystal. The coordinating agent is a compound having a donor lone pair that, for example, has a lone electron pair available to coordinate to a surface of the growing nanocrystal. The coordinating agent can be a solvent. Solvent coordination can stabilize the growing nanocrystal. Typical coordinating agents include alkyl phosphines, alkyl phosphine oxides, alkyl phosphonic acids, or alkyl phosphinic acids, however, other coordinating agents, such as pyridines, furans, and amines may also be suitable for the nanocrystal production. Examples of suitable coordinating agents include pyridine, tri-n-octyl phosphine (TOP) and tri-n-octyl phosphine oxide (TOPO). Technical grade TOPO can be used.

Nanocrystal shape can be determined by synthesis conditions, notably by the coordinating solvent(s) present during nanocrystal synthesis. The nanocrystal can be a sphere, rod, disk, or other shape. See, e.g., U.S. Pat. Nos. 6,225,198; 6,306,736; and 6,855,202, each of which is incorporated by reference in its entirety. Nanocrystal shape can be further controlled by the conditions under which a second semiconductor material is added to the nanocrystal.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average size, a population having a desired average nanocrystal size can be obtained. For example, a population of rod-shaped nanocrystals can have an average length of between 3 nm and 100 nm, such as between 5 nm and 40 nm. The population can have an average radius of between 1 nm and 10 nm, such as between 1.5 nm and 5 nm.

The particle size distribution can be further refined by size selective precipitation with a poor solvent for the nanocrystals, such as methanol/butanol as described in U.S. Pat. No. 6,322,901, incorporated herein by reference in its entirety. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean size, preferably 10% rms deviation or less, and more preferably 5% rms deviation or less.

The outer surface of the nanocrystal can include a layer of compounds derived from the coordinating agent used during the growth process. The surface can be modified by repeated exposure to an excess of a competing coordinating group to form an overlayer. For example, a dispersion of the nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal.

A cap including a second semiconductor material can be added to the nanocrystal. An capping process is described, for example, in U.S. Pat. No. 6,322,901, which is incorporated by reference in its entirety. By adjusting the temperature of the reaction mixture during capping and monitoring the absorption spectrum of the core, capped materials having high emission quantum efficiencies and narrow size distributions can be obtained. The shape of the cap can depend on the shape of the initial nanocrystal and the capping conditions used. For example, a cap grown on an approximately spherical nanocrystal can also be approximately spherical. In this case, the cap can substantially coat the spherical nanocrystal. If the initial nanocrystal is rod-shaped, the cap can be grown primarily on the ends of the rod and very little of the second semiconductor material added along the axis of the rod. A rod-shaped nanocrystal can be capped with a rod-shaped cap, or with an approximately spherical cap. Capping conditions, such as solvent composition and temperature, can determine the shape of the cap. For example, when caps are added under conditions that favor rod-shaped growth, rod-shaped caps can be formed; in contrast, approximately spherical caps are formed when the capping conditions favor approximately spherical growth.

It can be advantageous to purify semiconductor nanocrystals before a second semiconductor material is added to the nanocrystal. As discussed above, the nanocrystals can be purified by size-selective precipitation. After purification the nanocrystals can be treated with an etching agent. The etching agent can reduce the number of defect sites on the nanocrystals. Defect sites can act as undesired nucleation sites during addition of a second semiconductor nanocrystal. In making barbell-shaped nanocrystals, nucleation is desired at the ends of rods, but defect sites can cause nucleation along the length of a rod. Because the etching agent reduces the number of defect sites, the resulting barbells will have fewer warts along the length of the rods than barbells prepared without a prior etching treatment. The etching agent can be an amine, such as a primary amine, e.g., octylamine. An etching agent can be included during addition of a second semiconductor material to a nanocrystal.

Two-pot synthesis of nanocrystals can improve (compared to one-pot synthesis) the quality of the heterojunction by minimizing contamination of the one material with the other material. Adding the nanocrystals at temperatures normally used for core growth (rather than nucleation) can reduce overcoating of a rod (e.g., along the length of the rod) by the second semiconductor material.

Transmission electron microscopy (TEM) can provide information about the size, shape, and distribution of the nanocrystal population. Powder X-ray diffraction (XRD) patterns can provided the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from X-ray diffraction data using, for example, the Scherrer equation. It also can be estimated from the UV/Vis absorption spectrum.

EXAMPLES

In general, synthesis of semiconductor nanocrystals involves heating a solution of surfactants to an elevated temperature (e.g., 280-360° C.) and then rapidly injecting a solution of precursors to induce the nucleation of nanoparticles. The nanoparticles are then grown at a reduced temperature (200-260° C.) until the desired size and electronic properties re attained.

Synthesis of Copper Indium Zinc Sulfide (CIZS) Nanocrystals

To prepare CIZS nanocrystals, tetradecylphosphonic acid (TDPA, 0-42 mg) and trioctylphosphine (TOP, 3 mL) were degassed for one hour at 120° C. in a 25 mL three neck flask equipped with a thermocouple (attached to a temperature controller), reflux condenser, and a rubber septa for injection of precursors. In an inert glove box, solution (A) was prepared as follows: indium(III) iodide ($InI_3$, 49 mg), copper (I) iodide (CuI, 19 mg), and zinc(II) iodide ($ZnI_2$, varying from 0.5-64 mg) were combined with oleyl amine (OA, 2 mL). Solution (A) was then injected into the three neck flask, followed by heating to 280-360° C.

Also in the inert glove box solution (B) was prepared as follows: bis(trimethylsilyl)sulfide ($TMS_2(S)$, 27 mg) was combined with TOP (3 mL). The heating mantle was removed from the three neck reaction flask and solution (B) was then swiftly injected into the reaction flask at temperatures varying from 260-360° C. Heating was then restored to the flask for growth varying from 200-250° C. for 10-30 minutes. The resulting nanocrystals were then isolated from the growth solution by addition of butanol (3 mL) and acetone (15 mL) followed by centrifugation at 3900 rpm for 5 minutes. The supernatant was then discarded and the nanocrystals were suspended in chloroform.

CIZS nanocrystals were functionalized with an amphiphilic poly(acrylic acid) polymer to provide water solubility, according to Snee P T, et al. *JACS* 2006, 128: 13320-13321, which is incorporated by reference in its entirety. In addition, the hydrophobic capping ligands of CIZS nanocrystals can be replaced by a ligand exchange, for hydrophilic ligands such as cysteine, lipoic acid, or any other ligand suitable to make the nanocrystals water soluble.

Figure 2A:
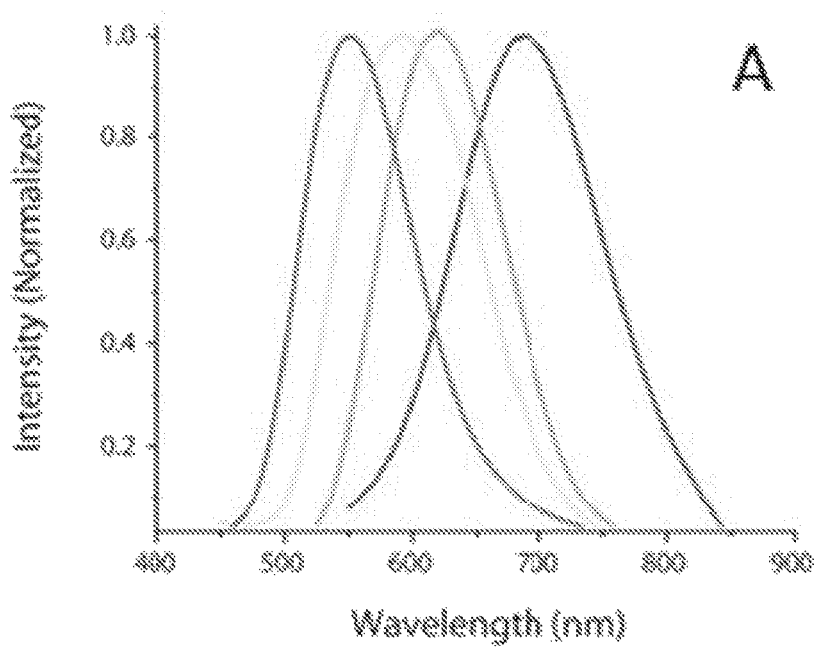
FIGS. 2A-2B are graphs illustrating optical properties of semiconductor nanocrystals.
Figure 2B:
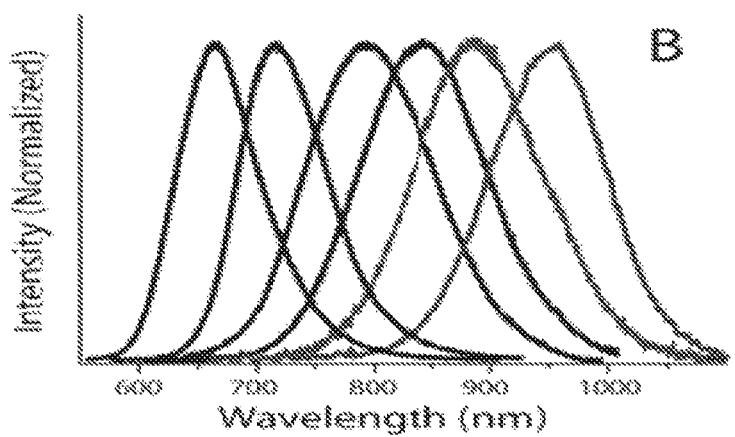
Figure 3A:
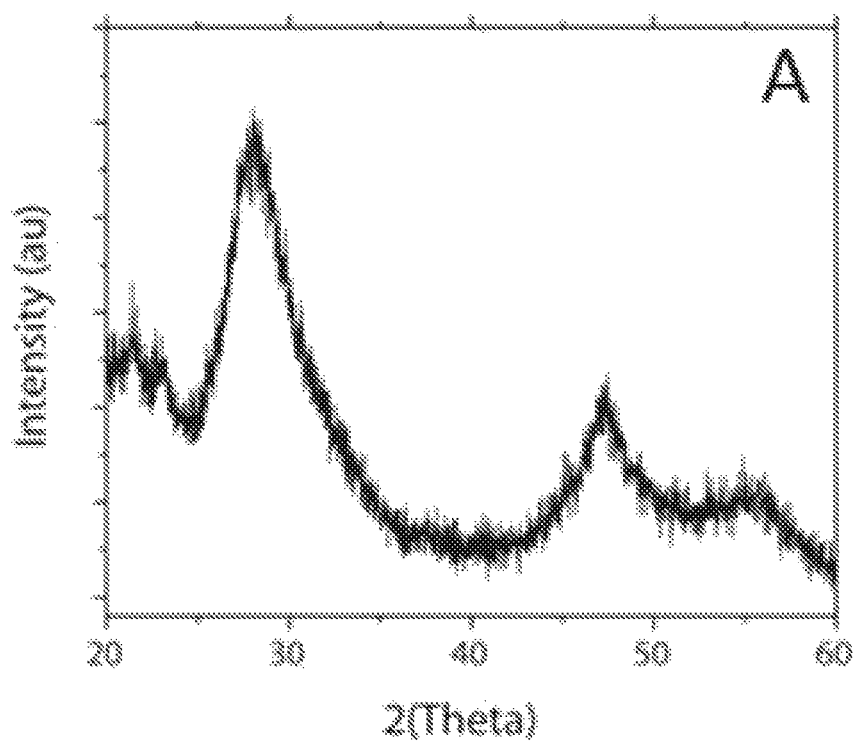
FIGS. 3A-3B are graphs illustrating powder X-ray diffraction data for semiconductor nanocrystals.
Figure 3B:
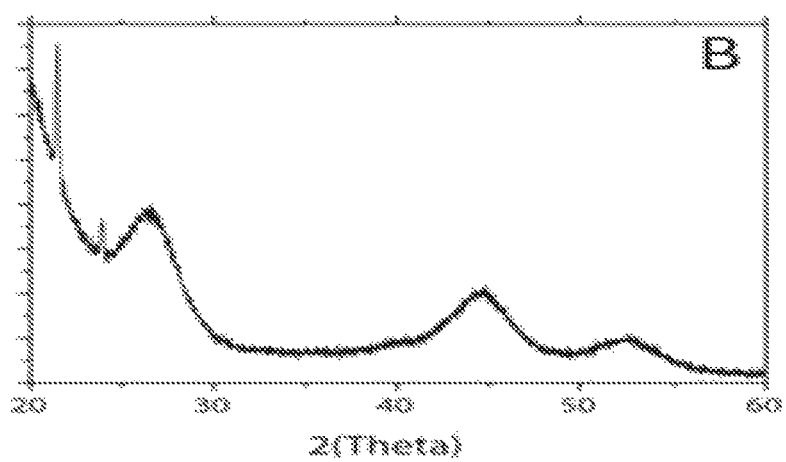
Figure 4A:
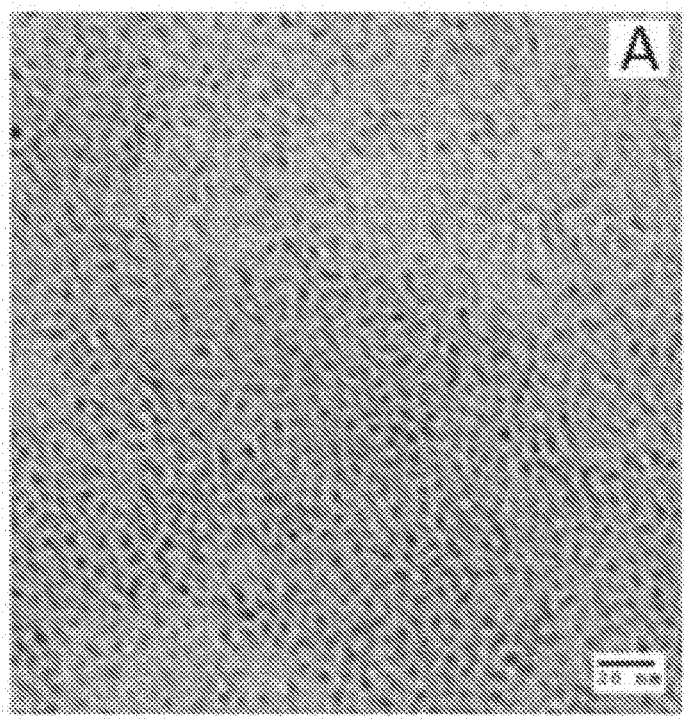
FIGS. 4A-4B are electron micrographs of semiconductor nanocrystals.
Figure 4B:
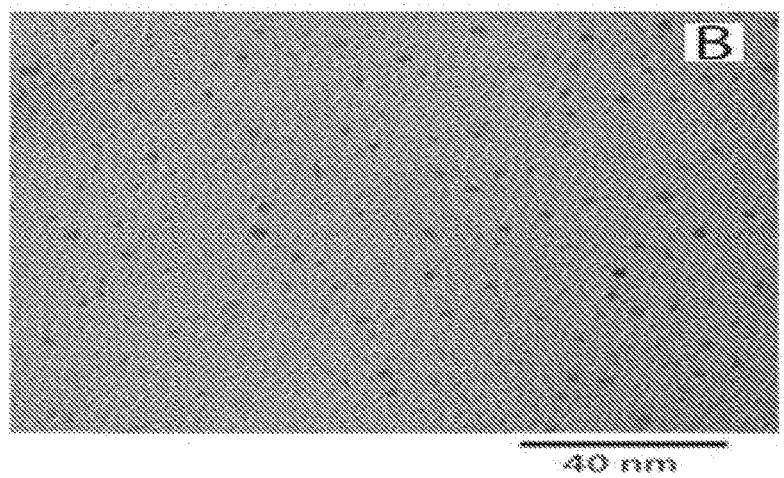

By varying the zinc content, as shown in the synthetic scheme, it was possible to tune the band gap of the resulting semiconductor nanocrystals. Low zinc concentrations in the growth solution create CIZS nanocrystals that are luminescent in the red and NIR regions (650-730 nm). High zinc concentrations in the growth solution create CIZS nanocrystals that exhibit green, yellow, and orange (540-650 nm) luminescence (FIGS. 2A-2B). The quantum yield of the prepared nanocrystals ranged from 20-35%. The CIZS nanocrystals also can have a shell of zinc sulfide (ZnS) overcoated on a surface of the core to serve as a physical and electronic passivating layer. The size of the prepared nanocrystals ranged from 2.2-2.7 nm (FIGS. 4A-4B). The crystal structure of the prepared nanocrystals matched the chalcopyrite structure of bulk copper indium sulfide, with slight deviations in lattice constants depending on the extent of zinc alloying (FIGS. 3A-3B).

Synthesis of $AgInSe_2$ Nanocrystals

To prepare $AgInSe_2$ nanocrystals TOP (2.0 mL) was injected into a 25 mL three neck flask (under nitrogen) equipped with a thermocouple (attached to a temperature controller), reflux condenser, and a rubber septum for injection of precursors. In an inert glove box solution (A) was prepared as follows: indium(III) iodide ($InI_3$, 0.05 mmol) and silver(I) iodide (AgI, 0.05 mmol) were combined with oleyl amine (OA, 1.5 mL). Solution (A) was then injected into the three neck flask, followed by heating to temperatures from 260-360° C. Also in an inert glove box, solution (B) was prepared as follows: bis(trimethylsilyl)selenide ($TMS_2(Se)$, 0.15 mmol) was combined with TOP (2.5 mL). Heating was removed from the three neck reaction flask and Solution (B) was then swiftly injected to the reaction flask at temperatures ranging from 260-360° C. Heating was then restored to the flask for growth at temperatures varying from 200-260° C. for 10-30 minutes. The resulting nanocrystals were then isolated from the growth solution as described above and dispersed in chloroform.

Figure 6A:
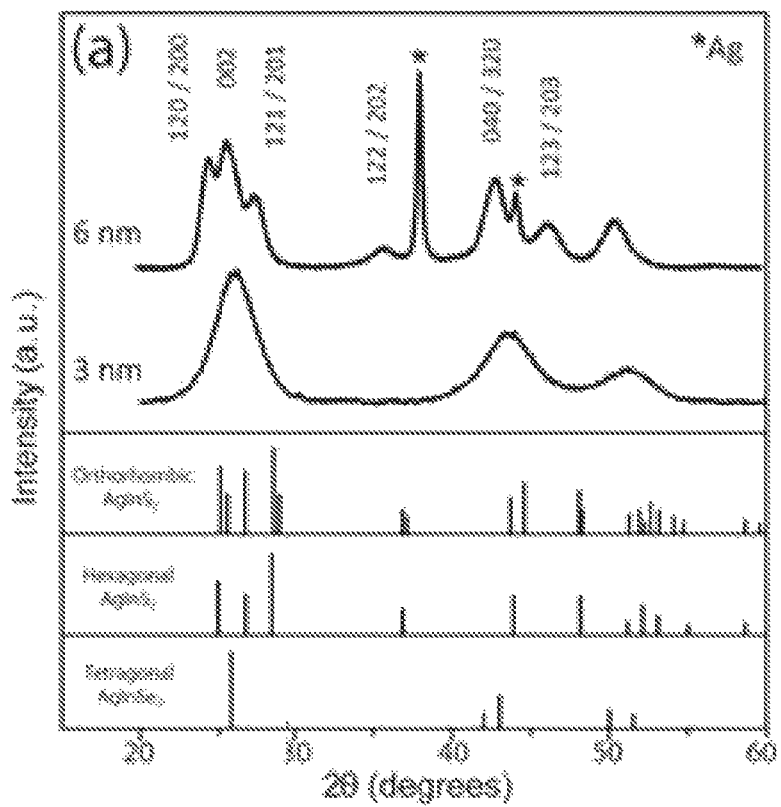
FIGS. 6A-6B are powder x-ray diffraction and absorption/emission spectra for semiconductor nanocrystals ($AgInSe_2$).
Figure 6B:
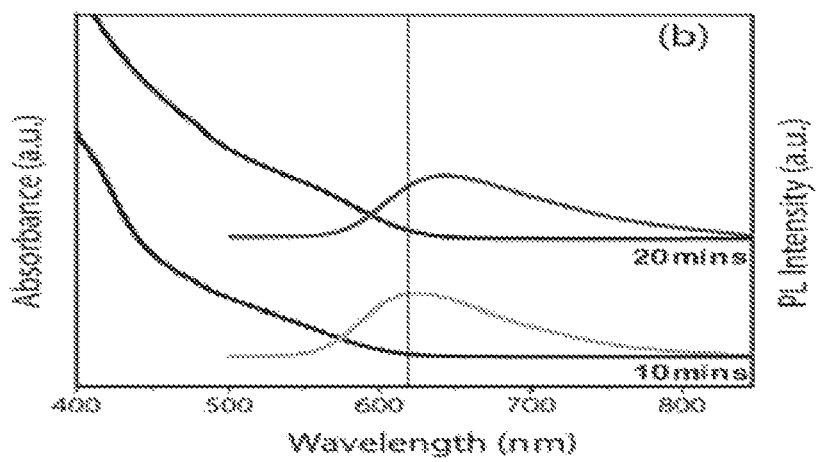

The $AgInSe_2$ nanocrystals were luminescent in the orange to red (600-650 nm) with quantum yields that reached 20%, as illustrated in FIG. 6B.

Synthesis of Copper Indium Selenide (CIS) Nanocrystals

To prepare CIS nanocrystals, TDPA (0-42 mg), TOP (3 mL), and trioctylphosphine oxide (TOPO, 0-4 g) were degassed for two hours at 120° C. in a 25 mL three neck flask equipped with a thermocouple (attached to a temperature controller), reflux condenser, and a rubber septa for injection of precursors. In an inert glove box solution (A) was prepared as follows: indium(III) iodide ($InI_3$, 49 mg) and copper(I) iodide (CuI, 19 mg) were combined with OA (1.5 mL). Solution (A) was then injected into the three neck flask, followed by heating to temperatures from 260-360° C. Also in the inert glove box, solution (B) was prepared as follows: bis(trimethylsilyl)selenide ($TMS_2(Se)$, 33 mg) was combined with tributylphosphine (TBP, 2 mL) and TOP (1 mL). Heating was removed from the three neck reaction flask and Solution (B) was then swiftly injected to the reaction flask at temperatures ranging from 260-360° C. Heating was then restored to the flask for growth at temperatures varying from 200-260° C. for 10-30 minutes. The resulting nanocrystals were then isolated from the growth solution as described above and dispersed in chloroform, solution (C).

$CuIn_5Se_8$ Nanocrystals

To prepare $CuIn_5Se_8$ nanocrystals, TOP (3 mL) was injected into a 25 mL three neck flask (under nitrogen) equipped with a thermocouple (attached to a temperature controller), reflux condenser, and a rubber septum for injection of precursors. In an inert glove box solution (A) was prepared as follows: indium(III) iodide ($InI_3$, 0.060 mmol) and copper(I) iodide (CuI, 0.015 mmol) were combined with OA (1.5 mL). Solution (A) was then injected into the three neck flask, followed by heating to temperatures from 260-360° C. Also in an inert glove box, solution (B) was prepared as follows: bis(trimethylsilyl)selenide ($TMS_2$(Se), 0.15 mmol) was combined with TOP (2 mL). Heating was removed from the three neck reaction flask and Solution (B) was then swiftly injected to the reaction flask at temperatures ranging from 260-360° C. Heating was then restored to the flask for growth at temperatures varying from 200-260° C. for 10-30 minutes. The resulting nanocrystals were then isolated from the growth solution as described above and dispersed in chloroform, solution (C).

$CuIn_{2.3}Se_4$ Nanocrystals

To prepare $CuIn_{2.3}Se_4$ nanocrystals, TOP (2.5 mL) was injected into a 25 mL three neck flask (under nitrogen) equipped with a thermocouple (attached to a temperature controller), reflux condenser, and a rubber septum for injection of precursors. In an inert glove box solution (A) was prepared as follows: indium(III) chloride ($InCl_3$, 0.25 mmol) and copper(I) chloride (CuCl, 0.25 mmol) were combined with OA (3.0 mL). Solution (A) was then injected into the three neck flask, followed by heating to temperatures from 260-360° C. Also in an inert glove box, solution (B) was prepared as follows: bis(trimethylsilyl)selenide ($TMS_2$(Se), 0.25 mmol) was combined with TOP (2.5 mL). Heating was removed from the three neck reaction flask and Solution (B) was then swiftly injected to the reaction flask at temperatures ranging from 260-360° C. Heating was then restored to the flask for growth at temperatures varying from 200-260° C. for 10-30 minutes. The resulting nanocrystals were then isolated from the growth solution as described above and dispersed in chloroform, solution (C).

CIS(ZnS) Core(Shell) Nanocrystals

In order to create a CIS(ZnS) core(shell) structure, solution (C) was injected into a 25 mL three neck flask equipped with a thermocouple (attached to a temperature controller), reflux condenser, and a rubber septum for injection of precursors. The reaction flask contained TOPO (5 g) that was degassed for two hours at 150° C. After solution (C) was injected, the reaction flask was adjusted to 60° C. and put under vacuum for 30 minutes. After the chloroform was removed, the flask was heated to 120° C. under vacuum for two hours. The reaction flask was then filled with nitrogen and heated to 150° C. In an inert glovebox solution (D) was prepared by adding diethyl zinc (10 mg) and $TMS_2$(S) (27 mg) to TOP (5 mL). This solution was then added by a syringe pump over one hour to the reaction flask. The resulting nanocrystals were isolated as described previously. A blue shift in emission was observed during this procedure, with 650 nm emitting nanocrystals shifting to 630 nm. The ZnS shell can be applied to all of the CIS nanocrystals.

The CIS(ZnS) nanocrystals were functionalized with an amphiphilic poly(acrylic acid) polymer to provide water solubility, according to Snee P T, et al. JACS 2006, 128: 13320-13321, which is incorporated by reference in its entirety. In addition, the hydrophobic capping ligands of CIS or CIS(ZnS) nanocrystals can be replaced by a ligand exchange, for hydrophilic ligands such as cysteine, lipoic acid, or any other ligand suitable to make the nanocrystals water soluble.

By varying the injection temperature, choice of metal halides, and concentration of TOPO in the growth solution it was possible to control the size and emission wavelength of the nanocrystals. A size series of CIS nanocrystals were prepared that had emission wavelengths varying from 650-975 nm (FIGS. 2A-2B). The size of the prepared nanocrystals ranged from 2-4 nm (FIGS. 4A-4B). The quantum yields of the CIS nanocrystals ranged from 10-30%. The crystal structure of the CIS nanocrystals matched the chalcopyrite structure and lattice constants of bulk copper indium selenide (FIGS. 3A-3B). The quantum yield for CIS(ZnS) nanocrystals was 45%.

Synthesis of Copper Indium Gallium Selenide (CIGS) Nanocrystals

To prepare CIGS nanocrystals, TDPA (0-42 mg), TOP (3 mL), and trioctylphosphine oxide (TOPO, 0-4 g) were degassed for two hours at 120° C. in a 25 ml three neck flask equipped with a thermocouple (attached to a temperature controller), reflux condenser, and a rubber septa for injection of precursors. In an inert glove box solution (A) was prepared as follows: indium(III) iodide [$InI_3$, (49-x) mg], gallium(III) iodide ($GaI_3$, x mg) and copper(I) iodide (CuI, 19 mg) were combined with OA (1.5 mL). The amount of gallium was varied from 0-49 mg to achieve different quaternary alloy compositions of the CIGS material. Solution (A) was then injected into the three neck flask, followed by heating to temperatures from 300-360° C. Also in the inert glove box solution (B) was prepared as follows: bis(trimethylsilyl)selenide ($TMS_2$(Se), 33 mg) was combined with tributylphosphine (TBP, 2 mL) and TOP (1 mL). Heating was removed from the three neck reaction flask and Solution (B) was then swiftly injected to the reaction flask at temperatures ranging from 260-360° C. Heating was then restored to the flask for growth at temperatures varying from 200-260° C. for 10-30 minutes. Cores were then isolated from the growth solution as in section (A) and dispersed into a solution of chloroform, solution (C).

Figure 5A:
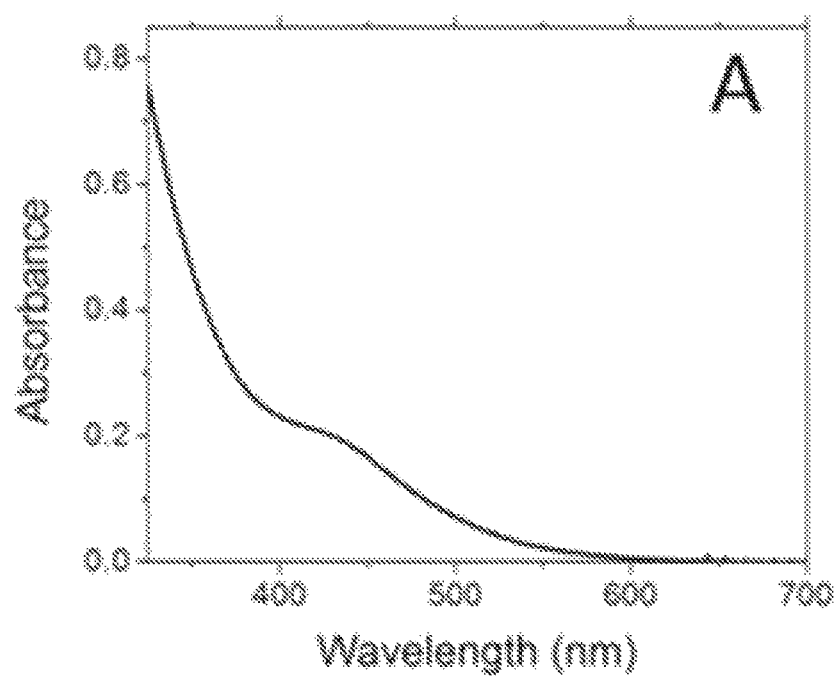
FIGS. 5A-5B are powder x-ray diffraction and absorption spectra for semiconductor nanocrystals.
Figure 5B:
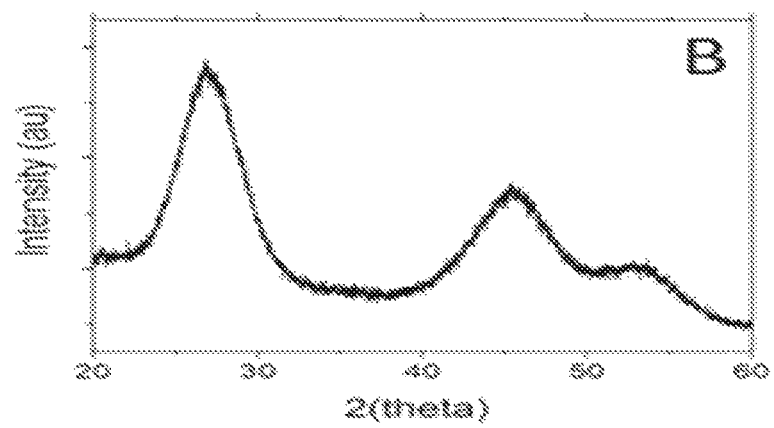

The crystal structure of the prepared nanocrystals matched the chalcopyrite structure of bulk copper indium selenide, with slight deviations in lattice constants depending on the extent of gallium alloying (FIGS. 5A-5B). The absorption features show a large blue shift from CIS nanocrystals, indicating a larger band gap due to the gallium incorporation (FIGS. 5A-5B).

The incorporation of gallium into CIGS nanocrystals caused a blue shifting of the excitonic band gap compared to that of CIS nanocrystals. Thin film CIGS solar cell devices can be made by annealing a thin film of CIGS nanocrystals into a polycrystalline bulk thin film of CIGS. Thus, CIGS nanocrystals may provide a low cost solution based route to CIGS thin film photovoltaic devices.

CIGS Nanocrystals for Thin Film Preparation

Nanoparticle inks can be used in the preparation of low cost CIGS solar cells. The nanoparticle inks can include nanocrystals of each separate element, or a combination of only two elements. Advantageously, the nanoparticle inks can include nanocrystals including a Group I-III-VI compound (e.g., CIS) or nanocrystals including a Group I-II-III-VI compound (e.g., CIGS). Because CIGS nanocrystals contain all four elements necessary for the formation of a CIGS thin film, it can provide a route to high quality CIGS thin films. A solution of CIGS nanoparticles is spin cast, drop cast, or printed, then is annealed at a temperature or temperatures in the range of 200-600° C. to create a thin film which acts as the absorber layer in CIGS solar cells.

Other embodiments are within the scope of the following claims.

What is claimed is:

1. A semiconductor nanocrystal comprising a core including a first IB-IIIA-VIA semiconductor material, wherein the nanocrystal has a luminescence quantum yield of at least 20%, wherein the nanocrystal has a peak luminescence emission wavelength in the range of 540 nm to no more than 975 nm,
   wherein the nanocrystal is a member of a nanocrystal population having an emission FWHM of no greater than 0.35 eV,
   wherein the group IB element is copper and the group IIIA element is indium, and the IB-IIIA-VIA semiconductor material is not $CuInGaS_2$.

2. The semiconductor nanocrystal of claim 1, wherein the nanocrystal has a luminescence quantum yield of at least 30%.

3. The semiconductor nanocrystal of claim 1, wherein the nanocrystal does not contain gallium.

4. The semiconductor nanocrystal of claim 1, wherein the nanocrystal does not include sulfur.

5. The semiconductor nanocrystal of claim 1, wherein the nanocrystal is a member of a nanocrystal population having an emission FWHM of no greater than 0.2 eV.

6. The semiconductor nanocrystal of claim 1, wherein the first IB-IIIA-VIA semiconductor material includes a smaller molar amount of copper than indium.

7. The semiconductor nanocrystal of claim 1, wherein the first IB-IIIA-VIA semiconductor material includes copper and indium in a ratio of less than 1:2.

8. The semiconductor nanocrystal of claim 1, wherein the group VIA element is sulfur.

9. The semiconductor nanocrystal of claim 1, wherein the nanocrystal is a member of a nanocrystal population having a deviation from mean radius of no greater than 15% rms.

10. The semiconductor nanocrystal of claim 1, wherein the core further includes a group IIB element.

11. The semiconductor nanocrystal of claim 1, wherein the first IB-IIIA-VIA semiconductor material is a copper indium selenide or a copper indium gallium selenide.

12. The semiconductor nanocrystal of claim 1, wherein the first IB-IIIA-VIA semiconductor material is an alloy with zinc sulfide.

13. The semiconductor nanocrystal of claim 12, wherein the alloy with zinc sulfide forms a core shell structure.

14. The semiconductor nanocrystal of claim 1, further comprising an overcoating on a surface of the core, the overcoating including a second semiconductor material.

15. The semiconductor nanocrystal of claim 1, further comprising a ligand on a surface of the semiconductor nanocrystal.

16. The semiconductor nanocrystal of claim 14, wherein the second semiconductor nanocrystal is water soluble.

17. The semiconductor nanocrystal of claim 1, wherein the core of the nanocrystal has a radius between 1 nm and 10 nm.

18. The semiconductor nanocrystal of claim 1, wherein the nanocrystal has a radius between 2 nm and 4 nm.

19. The semiconductor nanocrystal of claim 1, wherein the nanocrystal has a radius between 2.2 nm and 2.7 nm.

20. The semiconductor nanocrystal of claim 1, wherein molar amount of the IIIA element is more than the molar amount of the IB element.

21. The semiconductor nanocrystal of claim 1, wherein the first IB-IIIA-VIA semiconductor material is a copper indium selenide.

22. The semiconductor nanocrystal of claim 1, wherein the first IB-IIIA-VIA semiconductor material is a copper indium gallium selenide.

23. The semiconductor nanocrystal of claim 1, wherein the nanocrystal has a peak luminescence emission wavelength in the range of 530-670 nm.

24. The semiconductor nanocrystal of claim 1, wherein the nanocrystal has a peak luminescence emission wavelength in the range of 800-975 nm.

25. A semiconductor nanocrystal comprising a core including a first IB-IIIA-VIA semiconductor material, wherein the nanocrystal has a luminescence quantum yield of at least 20%, wherein the nanocrystal is a member of a nanocrystal population having a deviation from mean size of no greater than 25% rms, wherein the nanocrystal has a peak luminescence emission wavelength in the range of 540 nm to no more than 975 nm, wherein the core of the nanocrystal has a radius between 1 nm and 10 nm; and
   wherein the nanocrystal is a member of a nanocrystal population having an emission FWHM of no greater than 0.35 eV,
   wherein the group IB element is silver, and the IB-IIIA-VIA semiconductor material is not $CuInGaS_2$.

26. The semiconductor nanocrystal of claim 25, wherein the first IB-IIIA-VIA semiconductor material is a silver indium selenide.

27. A semiconductor nanocrystal comprising a IB-IIIA-VIA semiconductor material, wherein the nanocrystal has a luminescence quantum yield of at least 20%, wherein the nanocrystal has a peak luminescence emission wavelength in the range of 540 nm to no more than 975 nm,
   wherein the group IB element is copper, the group IIIA element is indium, and the group VIA element is sulfur, and the IB-IIIA-VIA semiconductor material is not $CuInGaS_2$.

28. The semiconductor nanocrystal of claim 27, wherein the nanocrystal has a peak luminescence emission wavelength in the range of 530-760 nm.

29. The semiconductor nanocrystal of claim 27, wherein the nanocrystal has a peak luminescence emission wavelength in the range of 780-975 nm.

30. The semiconductor nanocrystal of claim 27, wherein the first IB-IIIA-VIA semiconductor material includes a smaller molar amount of copper than indium.

* * * * *